(12) United States Patent
Zhang et al.

(10) Patent No.: US 7,538,002 B2
(45) Date of Patent: May 26, 2009

(54) SEMICONDUCTOR PROCESS INTEGRATING SOURCE/DRAIN STRESSORS AND INTERLEVEL DIELECTRIC LAYER STRESSORS

(75) Inventors: Da Zhang, Austin, TX (US); Vance H. Adams, Austin, TX (US); Bich-Yen Nguyen, Austin, TX (US); Paul A. Grudowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 246 days.

(21) Appl. No.: 11/361,171

(22) Filed: Feb. 24, 2006

(65) Prior Publication Data
US 2007/0202651 A1     Aug. 30, 2007

(51) Int. Cl.
*H01L 21/336*     (2006.01)
(52) U.S. Cl. .................. 438/296; 438/199; 438/239; 438/253; 438/259; 257/E21.431; 257/E21.438
(58) Field of Classification Search .................. 438/184
See application file for complete search history.

(56) References Cited

U.S. PATENT DOCUMENTS

| | | | |
|---|---|---|---|
| 6,350,661 B2 | 2/2002 | Lim et al. | |
| 6,580,122 B1 * | 6/2003 | Wristers et al. | ............. 257/330 |
| 6,621,131 B2 | 9/2003 | Murthy et al. | |
| 6,831,292 B2 | 12/2004 | Currie et al. | |
| 6,881,632 B2 | 4/2005 | Fitzgerald et al. | |
| 2005/0035470 A1 * | 2/2005 | Ko et al. | ...................... 257/900 |
| 2006/0022264 A1 * | 2/2006 | Mathew et al. | ............... 257/331 |
| 2006/0030093 A1 | 2/2006 | Zhang et al. | |

OTHER PUBLICATIONS

Ghani, T. et al.; A 90nm high volume manufacturing logic technology featuring novel 45nm gate length strained silicon CMOS transistors, IEDM Tech. Dig. p. 978 (2003).
Ge, C.H., et al.; Process-strained Si CMOS technology featuring 3D strain engineering, IEDM Tech. Dig. p. 73 (2003).
International Search Report and Written Opinion relating to PCT/US07/61841, dated Nov. 4, 2008.

* cited by examiner

*Primary Examiner*—N Drew Richards
*Assistant Examiner*—Kyoung Lee

(57) ABSTRACT

A semiconductor fabrication process includes forming isolation structures on either side of a transistor region, forming a gate structure overlying the transistor region, removing source/drain regions to form source/drain recesses, removing portions of the isolation structures to form recessed isolation structures, and filling the source/drain recesses with a source/drain stressor such as an epitaxially formed semiconductor. A lower surface of the source/drain recess is preferably deeper than an upper surface of the recessed isolation structure by approximately 10 to 30 nm. Filling the source/drain recesses may precede or follow forming the recessed isolation structures. An ILD stressor is then deposited over the transistor region such that the ILD stressor is adjacent to sidewalls of the source/drain structure thereby coupling the ILD stressor to the source/drain stressor. The ILD stressor is preferably compressive or tensile silicon nitride and the source/drain structure is preferably silicon germanium or silicon carbon.

20 Claims, 3 Drawing Sheets

SEMICONDUCTOR PROCESS INTEGRATING SOURCE/DRAIN STRESSORS AND INTERLEVEL DIELECTRIC LAYER STRESSORS

FIELD OF THE INVENTION

The invention is in the field of semiconductor fabrication processes and, more particularly, semiconductor fabrication processes employing strained silicon.

RELATED ART

Strained or stressed silicon is used in the field of semiconductor fabrication processing to enhance carrier mobility in deep sub-micron transistors. Proposals for implementing strained silicon include engineering of source/drain regions to provide a source/drain stressor adjacent to a silicon transistor channel (see, e.g., T. Ghani et al., *A 90 nm high volume manufacturing logic technology featuring novel 45 nm gate length strained silicon CMOS transistors,* IEDM Tech. Dig. p. 978 (2003) and U.S. Pat. No. 6,621,131 to Murthy et al., *Semiconductor Transistor Having a Stressed Channel*). Other proposals suggest depositing stress-inducing interlevel dielectric (ILD) layers over the transistor (see, e.g., C. H Ge et al., *Process-strained Si CMOS technology featuring 3D strain engineering,* IEDM Tech. Dig. p. 73, (2003)). It would be desirable to implement a process that facilitated optimal coupling of source/drain stressors and ILD stressors without increasing substantially increasing the cost or complexity of the fabrication process.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor fabrication process disclosed herein includes forming a transistor having stressed source/drain structures by etching recesses in source/drain regions of a semiconductor substrate. Isolation structures adjacent to the source/drain recesses are etched back so that the overlap between the isolation structure and an adjacent source/drain recess is less within a specified range. The source/drain recesses are then refilled and a strained dielectric is deposited over the entire structure. By having a small overlap between the strained source/drain regions and the adjacent isolation structures and by depositing a stress inducing dielectric layer, the described process achieves a desirable level of strain enhancement.

Figure 1:
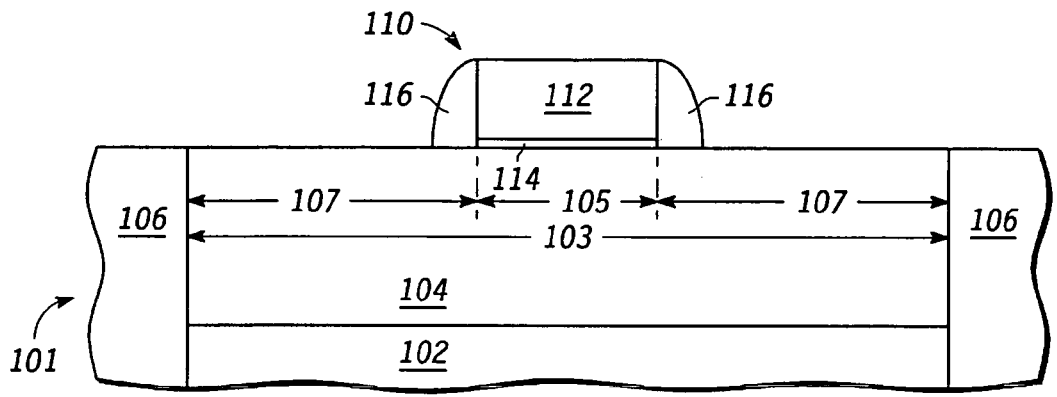
FIG. 1 is a partial cross sectional view of a wafer at a first stage in a semiconductor fabrication process, in which a transistor gate structure has been formed overlying a semiconductor substrate.

Turning now to the drawings, FIG. 1 is a partial cross sectional view of semiconductor wafer 101 at an intermediate stage in the fabrication of an integrated circuit designated by reference numeral 100. As depicted in FIG. 1, wafer 101 is a semiconductor on insulator (SOI) wafer in which a semiconductor layer 104 (also referred to as active layer 104) is positioned over a buried oxide (BOX) layer 102. A transistor region 103 includes the portion of semiconductor layer 104 positioned between a pair of dielectric isolation structures 106. Semiconductor layer 104 is preferably, lightly doped n-type or p-type single crystal silicon. Isolation dielectric structures 106 and BOX layer 102 are dielectrics such as a suitable deposited or thermally formed silicon oxide compound.

A gate structure 110 has been formed overlying a portion of transistor region 103 in active layer 104. Gate structure 110 includes an electrically conductive gate electrode 112 overlying a gate dielectric layer 114. Gate dielectric layer 114 is positioned overlying and preferably on top of or in contact with active layer 104. Spacer structures 116 are located on sidewalls of gate electrode 112.

In a likely implementation, gate electrode 112 is p-type or n-type polycrystalline silicon (polysilicon) formed in a conventional manner such as the thermal decomposition of silane. In other embodiment, gate electrode 112 may be a metallic gate electrode or another electrically conductive material. The gate dielectric 114 may be a thermally formed silicon dioxide film, a "high K" material such as silicon nitride, any of various metal oxide compounds such as $HfO_2$., or combinations of the above. Spacers 116 are likely a dielectric material such as silicon oxide, silicon nitride, or the like. Spacers 116 may consist of multiple layers of materials, such as a combination of silicon oxide and silicon nitride.

The location of gate structure 110 defines approximate boundaries of a channel region 105 and a pair of source/drain regions 107 in active layer 104. Lateral boundaries of channel region 105 within active layer 104 coincide with the sidewalls of gate electrode 112 while the source/drain regions 107 include the remaining portions of active layer 104. In other words, source/drain regions 107 occupy the portion of active layer 104 between channel region 105 and isolation structures 106.

Figure 2:
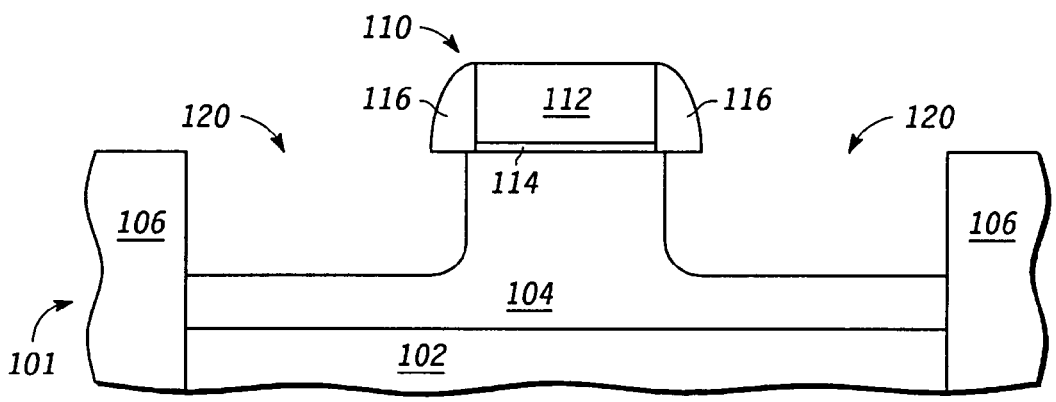
FIG. 2 depicts processing subsequent to FIG. 1 in which voids are formed in source/drain regions of the substrate positioned on either side of a transistor channel region underlying the gate structure.

Referring now to FIG. 2, source/drain recesses 120 are formed by removing portions of source/drain regions 107 (see FIG. 1) of semiconductor layer 104. In a preferred embodiment, source/drain recesses 120 are formed with an etch process that may include a dry or anisotropic component, a wet or isotropic component, or a combination of both. For embodiments in which active layer 104 is single crystal silicon, a plasma containing a chlorine species such as $Cl_2$, a fluorine species such as $SF_6$, or a combination of both may be used to form source/drain recesses 120. In one embodiment, a depth of source/drain recesses 120 is in the range of approximately 30 to 200 nm. In the depicted embodiment, formation of source/drain recesses 120 results in some undercutting of spacer structures 116. Also in the depicted embodiment, the source/drain recess etch process is highly selective with respect to isolation structures 106.

Figure 3:
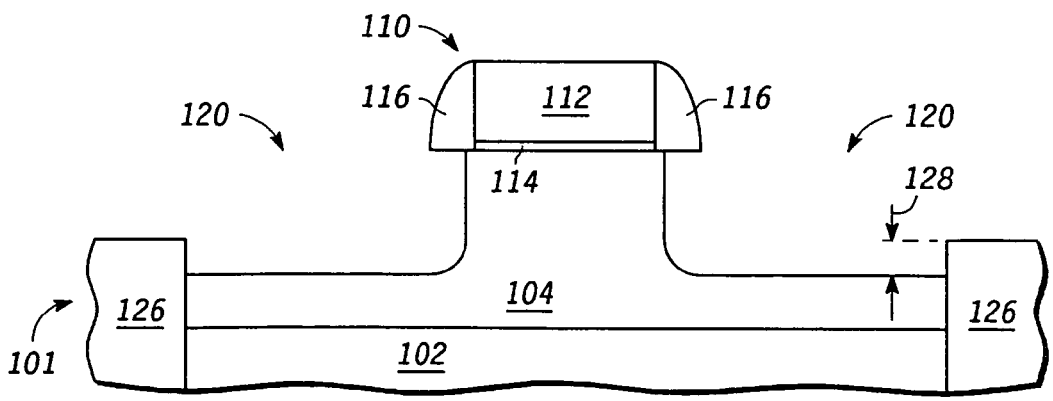
FIG. 3 depicts processing subsequent to FIG. 2 in which isolation structures are etched back.

Turning now to FIG. 3, following the formation of source/drain recesses 120, upper portions of isolation structures 106 of FIG. 2 are etched or otherwise removed to form recessed isolation structures 126. In the depicted embodiment, the etch used to form isolation structures 126 is controlled to produce an overlap 128 within a desired range. In one embodiment, overlap 128 is preferably in the range of approximately 10 to 30 nm. Overlap 128 must be greater than zero to prevent unintended processing, including etching, of active layer 104, BOX layer 102, or both.

Figure 4:
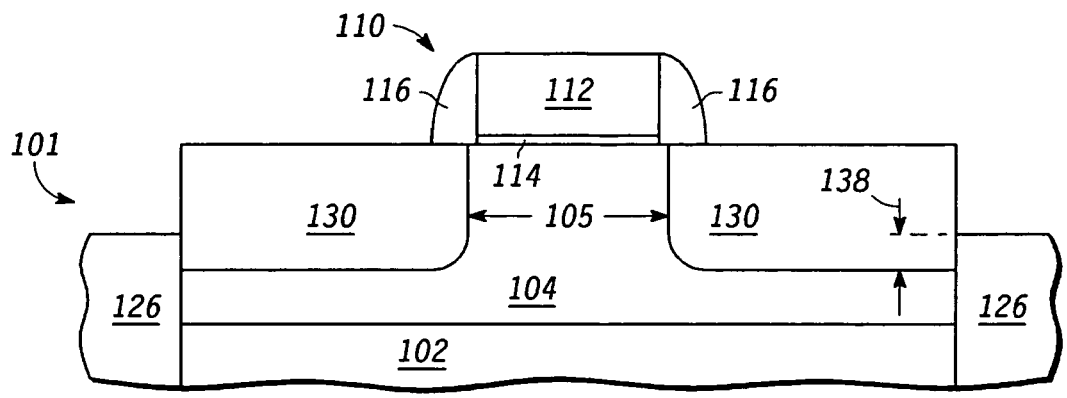
FIG. 4 depicts processing subsequent to FIG. 3 in which a source/drain semiconductor is grown.

Turning now to FIG. 4, source/drain structures 130 are formed in the source/drain recesses 120 of FIG. 3. Source/drain structures 130 are preferably a crystalline semiconductor material having a lattice constant that differs from the lattice constant of active layer 104. For embodiments in which active layer 104 is silicon, source/drain structures 130 may be a silicon germanium compound for PMOS transistors, where a compressive stressor is desired, or silicon carbon for NMOS transistors when a tensile stressor is desired. In the case of silicon germanium, the composition of the silicon germanium stressor is preferably $Si_{1-X}Ge_X$ where X (the percentage of germanium) is in the range of approximately 10 to 50%. In the case of silicon carbon, the composition of the silicon carbon stressor is preferably $Si_{1-X}C_X$ where X (the percentage of carbon) is in the range of approximately 0.5 to 5%. In the preferred embodiment, formation of source/drain structures 130 is achieved by epitaxial growth using active layer 104 as a seed. As depicted in FIG. 4, an upper surface of recessed isolation structure 126 is vertically displaced above a lower surface of source/drain structure 130 by a displacement or overlap 138.

In a preferred embodiment, displacement 138 is substantially equal to the overlap 128 illustrated in FIG. 2 before the formation of source/drain structures 130.

Integrated circuit 100 as depicted in FIG. 4 includes a source/drain structure 130 having a lattice constant that differs from the lattice constant of active layer 104 and, therefore, provides compressive or tensile stress to transistor channel region 105. In these embodiments, source/drain structures 130 are referred to as source/drain stressors. Embodiments that employ silicon germanium compounds for source/drain structures 130 and silicon for active layer 104 produce compressive stress on channel region 105. This compressive stress beneficially enhances the carrier mobility in channel region 105 of PMOS devices. Embodiments that employ silicon carbon compounds for source/drain structures 130 and silicon for active layer 104 produce tensile stress on channel region 105. This compressive stress beneficially enhances the carrier mobility in channel region 105 of NMOS devices.

Figure 6:
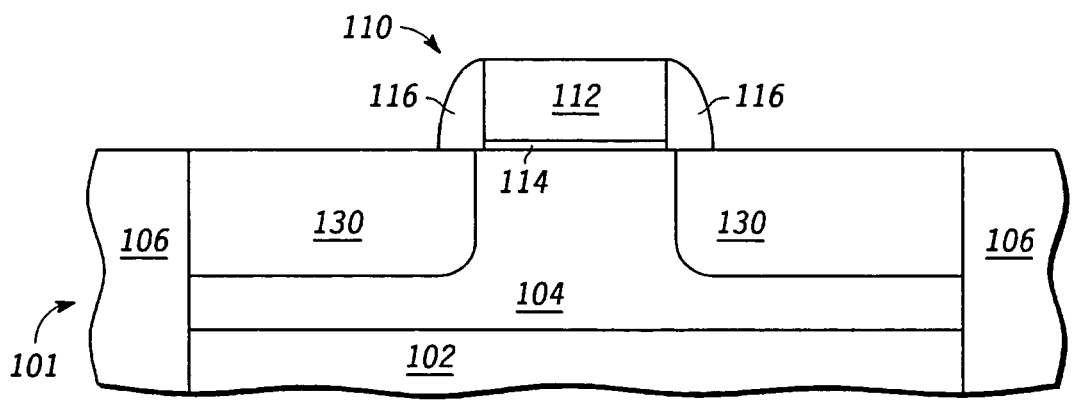
FIG. 6 depicts processing subsequent to FIG. 2, as an alternative to the processing depicted in FIG. 3 and FIG. 4, in which the source/drain voids are refilled with a source/drain structure.
Figure 7:
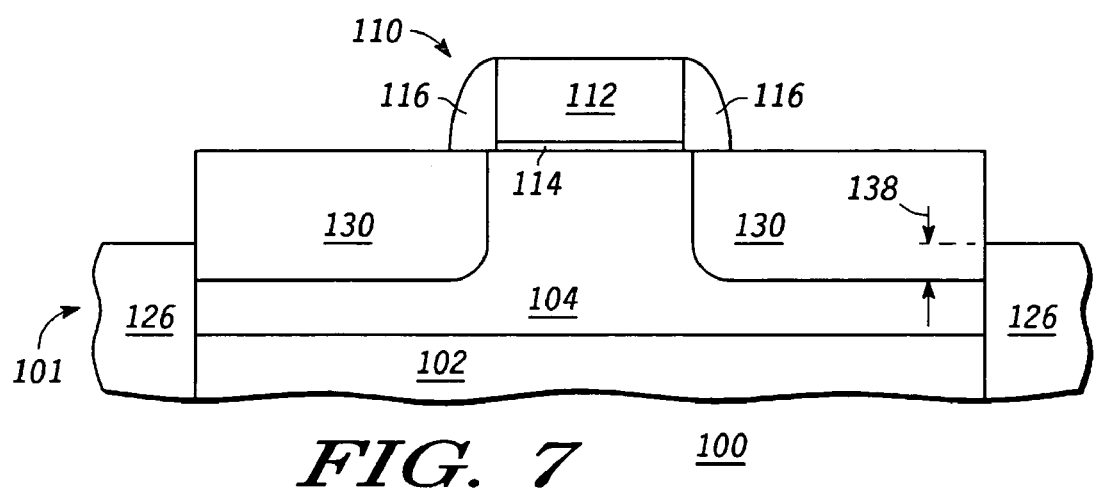
FIG. 7 depicts processing subsequent to FIG. 6 in which isolation structures are recessed after formation of the source/drain structures.

The sequence depicted in FIG. 2, FIG. 3, and FIG. 4 may be altered without substantially altering the resulting integrated circuit 100. For example, although the depicted sequence forms source/drain voids 120 and recessed isolation structures 126 before forming source/drain structures 130, other embodiments may perform the epitaxial formation of source/drain structures 130 prior to recessing isolation structures 106. This sequence is illustrated in FIG. 6 and FIG. 7, which depict a processing sequence that substitutes for the processing depicted in FIG. 3 and FIG. 4 as described above.

Moreover, although the depicted embodiments employ a highly selective first etch for etching source/drain regions 107 to form source/drain voids 120 and a highly selective second etch to recess isolation structures 106 to form recessed isolation structures 126, other embodiments may use an etch process having an intermediate selectivity between active layer 104 and isolation structure 106 with the etch rate for active layer 104 only moderately exceeding the etch rate of isolation structures 106. In this embodiment, source/drain voids 120 and recessed isolation structures 126 may be formed substantially simultaneously using a single etch processing sequence.

Figure 5:
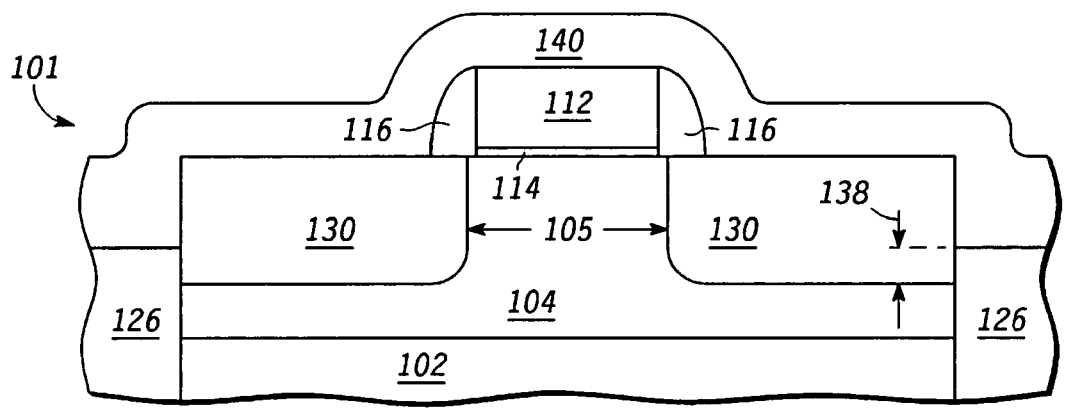
FIG. 5 depicts processing subsequent to FIG. 4 in which a dielectric layer is deposited over the transistor.

Turning now to FIG. 5, a dielectric layer, referred to herein as interlevel dielectric (ILD) stressor layer 140, is blanket deposited to cover wafer 101 including recessed isolation structure 126. As depicted in FIG. 5, ILD stressor layer 140 thus contacts a portion of the sidewall of source/drain structure 130 exposed by recessed isolation structure 126. In the preferred embodiment, ILD stressor layer 140 is a dielectric material that is inherently strained when deposited on or adjacent to silicon. The nature of the strain (i.e., being compressive or tensile) for the ILD stressor is preferably the same as that for the source/drain stressor. Thus, ILD stressor layer 140 is compressive for PMOS regions of the integrated circuit and tensile for NMOS regions. In this embodiment, ILD stressor layer 140 provides additional strain enhancement to channel region 105 by contacting the exposed sidewalls of source/drain structures 130. ILD stressor layer 140 may include compressive silicon nitride in PMOS regions and tensile silicon nitride in NMOS regions.

By enabling ILD stressor layer to contact the sidewall of source/drain structures 130, the recessed isolation structure facilitates optimized coupling of ILD stressor layer 140 to source/drain structures 130 and transistor channel 105. For regions of the wafer where the ILD stressor layer 140 with a specific strain type is un-desirable, ILD stressor layer 140 may be locally replaced with a different ILD film, or it may be locally relaxed by implantation under photoresist patterning.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment employs an SOI wafer as a starting material, the described processing is applicable to the processes using a conventional, bulk silicon starting material. Similarly, although the described implementation illustrates a transistor having a conventional, single gate electrode, non-volatile embodiments of the invention may use floating gate transistor technology, nanocrystal gate technology, and the like. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming first and second isolation structures laterally positioned on either side of a transistor region of a semiconductor layer;
   forming a gate structure overlying a portion of the transistor region, wherein the gate structure includes an electrically conductive gate electrode overlying a gate dielectric layer overlying the semiconductor layer, and further wherein sidewalls of the gate electrode define boundaries of a channel region underlying the gate structure and source/drain regions on either side of the channel region extending between the channel region and the first and second isolation structures;
   removing portions of the semiconductor layer in the source/drain regions to form source/drain recesses;
   removing upper portions of the first and second isolation structures to form first and second recessed isolation structures, wherein a lower surface of the source/drain recesses and an upper surface of the first and second recessed isolation structures are vertically displaced below an upper surface of the semiconductor substrate by a first displacement and a second displacement respectively, wherein the first displacement is greater than the second displacement; and
   filling the source/drain recesses with a source/drain stressor.

2. The semiconductor fabrication process of claim 1, wherein forming first and second isolation structures comprises forming first and second silicon-oxide shallow trench isolation (STI) structures.

3. The semiconductor fabrication process of claim 1 wherein the first displacement exceeds the second displacement by a displacement in a range of approximately 10 to 30 nm.

4. The semiconductor fabrication process of claim 1 wherein said filling the source/drain recesses precedes said forming of the first and second recessed isolation structures.

5. The semiconductor fabrication process of claim 1 wherein said forming of the first and second recessed isolation structures precedes said filling of the source/drain recesses.

6. The semiconductor fabrication process of claim 1, further comprising, blanket depositing an interlevel dielectric layer (ILD) stressor, wherein the ILD stressor is adjacent a sidewall of the source/drain stressor.

7. The semiconductor fabrication process of claim 6, wherein depositing the ILD stressor comprises depositing strained silicon nitride.

8. The semiconductor fabrication process of claim 1 wherein the semiconductor substrate comprises silicon and wherein filling the source/drain recess includes epitaxially growing a semiconductor source/drain structure, wherein a lattice constant of the semiconductor source/drain structure differs from the lattice constant of silicon.

9. The semiconductor fabrication process of claim 8, wherein the semiconductor source/drain stressor comprises a silicon germanium compound having a germanium content in a range of approximately 10 to 50%.

10. The semiconductor fabrication process of claim 8, wherein the semiconductor source/drain stressor comprises a silicon carbon compound having a carbon content in a range of approximately 0.5 to 5%.

11. The semiconductor fabrication process of claim 1 wherein filling the source/drain recesses with the source/drain stressor comprises forming the source/drain stressor having a lattice constant different from a lattice constant of the semiconductor layer.

12. The semiconductor fabrication process of claim 6, wherein the semiconductor substrate comprises silicon and wherein filling the source/drain recess includes epitaxially growing a semiconductor source/drain structure, wherein a lattice constant of the semiconductor source/drain structure differs from the lattice constant of silicon.

13. The semiconductor fabrication process of claim 12, wherein the first displacement exceeds the second displacement by a displacement in a range of approximately 10 to 30 nm.

14. The semiconductor fabrication process of claim 13, wherein said filling the source/drain recesses precedes said forming of the first and second recessed isolation structures.

15. The semiconductor fabrication process of claim 13, wherein said forming of the first and second recessed isolation structures precedes said filling of the source/drain recesses.

16. A semiconductor fabrication process, comprising:
   forming first and second isolation structures laterally positioned on either side of a transistor region of a semiconductor layer, wherein forming first and second isolation structures comprises forming first and second silicon-oxide shallow trench isolation (STI) structures;
   forming a gate structure overlying a portion of the transistor region, wherein the gate structure includes an electrically conductive gate electrode overlying a gate dielectric layer overlying the semiconductor layer, and further wherein sidewalls of the gate electrode define boundaries of a channel region underlying the gate structure and source/drain regions on either side of the channel region extending between the channel region and the first and second isolation structures;
   removing portions of the semiconductor layer in the source/drain regions to form source/drain recesses;
   removing upper portions of the first and second isolation structures to form first and second recessed isolation structures, wherein a lower surface of the source/drain recesses and an upper surface of the first and second recessed isolation structures are vertically displaced below an upper surface of the semiconductor substrate by a first displacement and a second displacement respectively, wherein the first displacement is greater than the second displacement; and
   filling the source/drain recesses with a source/drain stressor, wherein filling the source/drain recesses with the source/drain stressor comprises forming the source/drain stressor having a lattice constant different from a lattice constant of the semiconductor layer.

17. A semiconductor fabrication process, comprising:
   forming first and second isolation structures laterally positioned on either side of a transistor region of a semiconductor layer, wherein forming first and second isolation structures comprises forming first and second silicon-oxide shallow trench isolation (STI) structures;
   forming a gate structure overlying a portion of the transistor region, wherein the gate structure includes an electrically conductive gate electrode overlying a gate dielectric layer overlying the semiconductor layer, and further wherein sidewalls of the gate electrode define boundaries of a channel region underlying the gate structure and source/drain regions on either side of the channel region extending between the channel region and the first and second isolation structures;

removing portions of the semiconductor layer in the source/drain regions to form source/drain recesses;

removing upper portions of the first and second isolation structures to form first and second recessed isolation structures, wherein a lower surface of the source/drain recesses and an upper surface of the first and second recessed isolation structures are vertically displaced below an upper surface of the semiconductor substrate by a first displacement and a second displacement respectively, wherein the first displacement is greater than the second displacement;

filling the source/drain recesses with a source/drain stressor; and blanket depositing an interlevel dielectric layer (ILD) stressor, wherein the ILD stressor is adjacent a sidewall of the source/drain stressor.

18. The semiconductor fabrication process of claim 17, wherein the semiconductor substrate comprises silicon and wherein filling the source/drain recess includes epitaxially growing a semiconductor source/drain structure, wherein a lattice constant of the semiconductor source/drain structure differs from the lattice constant of silicon.

19. The semiconductor fabrication process of claim 18, wherein said filling the source/drain recesses precedes said forming of the first and second recessed isolation structures.

20. The semiconductor fabrication process of claim 18, wherein said forming of the first and second recessed isolation structures precedes said filling of the source/drain recesses.

* * * * *